United States Patent
Arimitsu et al.

(12)

(10) Patent No.: US 6,312,614 B1
(45) Date of Patent: Nov. 6, 2001

(54) METHOD FOR PRODUCTION OF INTERPOSER FOR MOUNTING SEMICONDUCTOR ELEMENT

(75) Inventors: Yoshio Arimitsu; Yutaka Kaneda, both of Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/577,883

(22) Filed: May 25, 2000

(30) Foreign Application Priority Data

Jun. 10, 1999 (JP) ................................... 11-164148

(51) Int. Cl.⁷ .............................. H01L 21/00; B44C 1/22
(52) U.S. Cl. .................... 216/13; 216/20; 216/41; 438/689
(58) Field of Search .................... 216/13, 14, 20, 216/41; 438/689

(56) References Cited

U.S. PATENT DOCUMENTS 5,480,048 * 1/1996 Kitamura et al. ................ 216/13
5,509,553 * 4/1996 Hunter et al. .................... 216/13
5,733,466 * 3/1998 Benebo et al. ................... 216/13

FOREIGN PATENT DOCUMENTS 63-18355 4/1988 (JP).
9-51155 2/1997 (JP).

* cited by examiner

Primary Examiner—William A. Powell
(74) Attorney, Agent, or Firm—Oliff & Berridge, PLC

(57) ABSTRACT

A semiconductor element mounting interposer is produced by (A) forming a conducting circuit that comprises motherboard connecting electrodes 2 and plated leads 3 on an insulating base film 1; (B) forming a patterning resin layer 5 over the conducting circuit 4; (C) etching patterning resin layer 5 so as to expose the motherboard connecting electrodes 2 and plated leads 3; (D) masking plated leads 3 with an electroplating resist layer 6; (E) depositing an electroplated metal layer 7 over the exposed motherboard connecting electrodes 2; (F) removing the electroplating resist layer 6; (G) removing the exposed plated leads 3 through etching; and (H) where the patterning resin layer 5 is a polyimide precursor layer, bringing about complete imidation of the polyimide precursor layer.

7 Claims, 3 Drawing Sheets

METHOD FOR PRODUCTION OF INTERPOSER FOR MOUNTING SEMICONDUCTOR ELEMENT

BACKGROUND OF THE INVENTION

1. Field of the Invention

The present invention relates to a method for production of an interposer for mounting a semiconductor element, where the interposer is used in mounting a semiconductor element onto a motherboard.

2. Description of the Related Art

In recent years, electronic devices equipped with semiconductor elements have become increasingly more compact and lightweight, and this trend has led to the development of the chip-size package (CSP) in which the semiconductor element is mounted on a circuit board, termed an interposer (namely, a semiconductor element mounting interposer), that has substantially the same dimensions as the semiconductor element, which package is then mounted on the motherboard.

Semiconductor element mounting interposers of this type are produced in the manner depicted in FIGS. 3A to 3D.

First, on an insulating base film 31 is formed a conducting circuit 34 that includes motherboard connecting electrodes 32 for interconnection with the motherboard, and plated leads 33 providing conduction paths to the motherboard connecting electrodes 32 to permit electroplating of the motherboard connecting electrodes 32, as in FIG. 3A. The plated leads 33 are in electrical connection with continuous conductors 31a situated at the two edges of insulating base film 31.

The semiconductor element mounting interposer is also provided with through-holes 35 which lead the motherboard connecting electrodes 32 to a semiconductor element (not shown) on the backside.

Next, the conducting circuit 34 is subjected to a electroplating process to deposit an electroplated metal layer 36 covering at least the motherboard connecting electrodes 32, as in FIG. 3B.

Next, using a die, the plated leads are severed by making holes 37 in proximity to the motherboard connecting electrodes 32 so as to make the plated leads 33 as short as possible, as in FIG. 3C. Where needed, the continuous conductors 31a situated at the two edges of the insulating base film 31 are trimmed, as in FIG. 3D.

The reason for cutting the plated leads 33 in proximity to the motherboard connecting electrodes 32 as in FIG. 3C is as follows.

Where the plated leads 33 in electrical connection with the motherboard connecting electrodes 32 on insulating base film 31 have considerable lengthwise extension, since it is in the nature of branches to produce reflection noise, and since it is in the nature of redundant circuits to increase reactance and capacity, the electrical characteristics of the semiconductor element are adversely affected. It is also necessary for the motherboard connecting electrodes 32 to be electrically isolated from one another. Accordingly, to produce the semiconductor element mounting interposer in an efficient manner, electroplating of the motherboard connecting electrodes 32 is followed by a process of making holes 37 in proximity to the motherboard connecting electrodes 32 so as to make the plated leads 33 as short as possible.

However, production of holes with a die produces flash around the edges of the holes, which can in some instances result in unacceptable appearance or impaired performance.

In CSP production, the presence of holes on the circuit substrate tends to make resin encapsulation difficult. Further, the mechanical production of holes in a small CSP polyimide base film with good precision and without damage to the base film is not a simple operation. Also, considerable costs are entailed in die fabrication.

SUMMARY OF THE INVENTION

The present invention was developed in view of the problems pertaining to the prior art, and has as an object to provide, in the production of semiconductor element mounting interposer for a CSP substrate or the like, a way to ensure electrical isolation of the motherboard connecting electrodes from one another and to make the plating leads as short as possible, without the need to produce holes mechanically with a die.

The inventors perfected the present invention upon discovering that, in the process of manufacturing a semiconductor element mounting interposer, the aforementioned problems can be solved by using an etching process to trim the plated leads situated on the side of the interposer that will be mounted to the motherboard, and that this can be accomplished using a chemically-etchable patterning resin layer (e.g., an alkali solution-etchable polyimide precursor layer (polyamic acid layer, etc.), photosensitive polyimide layer, or photoresist layer) as an etching resist during etching of the plated leads.

Specifically, the first invention provides a method for production of a semiconductor element mounting interposer for use in mounting a semiconductor element onto a motherboard, comprising the following steps (A) to (G):

(A) forming a conducting circuit that comprises motherboard connecting electrodes for interconnection with a motherboard, and plated leads in electrical connection with said motherboard connecting electrodes so as to permit electroplating of said motherboard connecting electrodes on an insulating base film;

(B) forming a patterning resin layer over said conducting circuit;

(C) etching said patterning resin layer so as to expose the motherboard connecting electrodes and plated leads of said conducting circuit;

(D) masking the exposed plated leads with an electroplating resist layer;

(E) subjecting the exposed motherboard connecting electrodes to an electroplating process so as to deposit an electroplated metal layer over the motherboard connecting electrodes;

(F) removing the electroplating resist layer masking the plated leads to re-expose the plated leads; and (G) removing the exposed plated leads through etching.

The second invention provides a method for production of a semiconductor element mounting interposer for use in mounting a semiconductor element onto a motherboard, comprising the following steps (a) to (f):

(a) forming a conducting circuit that comprises motherboard connecting electrodes for interconnection with a motherboard, and plated leads in electrical connection with said motherboard connecting electrodes so as to permit electroplating of said motherboard connecting electrodes on an insulating base film;

(b) forming a patterning resin layer over said conducting circuit;

(c) etching said patterning resin layer so as to expose the motherboard connecting electrodes of said conducting circuit;

(d) subjecting the exposed motherboard connecting electrodes to an electroplating process so as to deposit an electroplated metal layer over the motherboard connecting electrodes;

(e) etching said patterning resin layer so as to expose the plated leads of said conducting circuit; and (f) removing the exposed plated leads through etching.

Other objects and features of the present invention will be described or become apparent from the following disclosure.

DESCRIPTION OF THE PREFERRED EMBODIMENTS

The method for production of a semiconductor element mounting interposer pertaining to the first invention is now described step by step making reference to the accompanying drawings.

STEP (A)

Figure 1A:
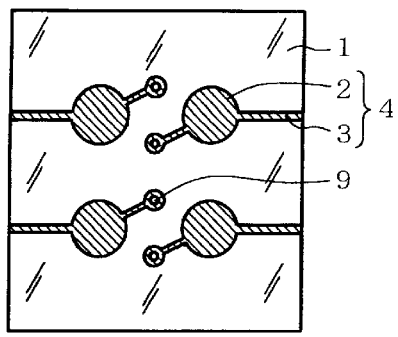
FIGS. 1A to 1H are step diagrams illustrating production of the semiconductor element mounting interposer of the invention.
Figure 3A:
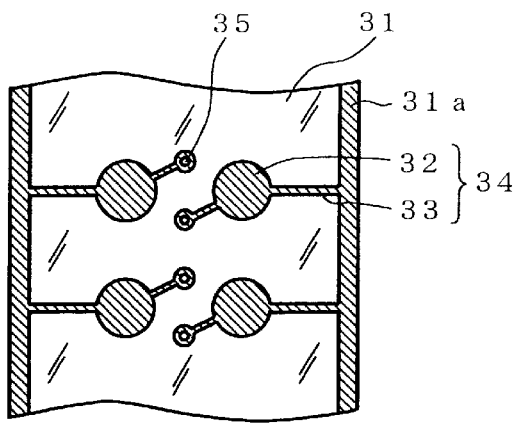
FIGS. 3A to 3D are step diagrams illustrating production of a conventional semiconductor element mounting interposer.
Figure 3B:
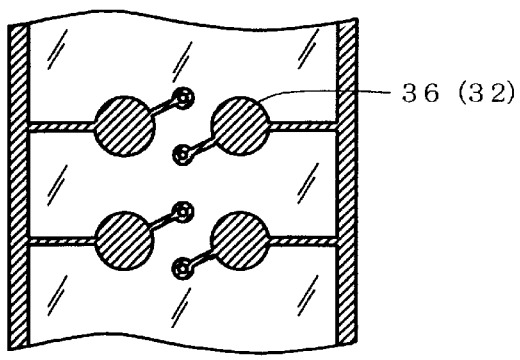
Figure 3C:
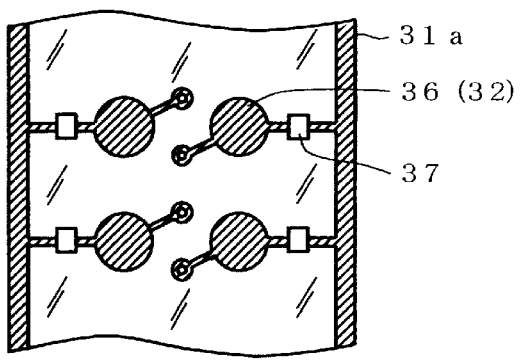
Figure 3D:
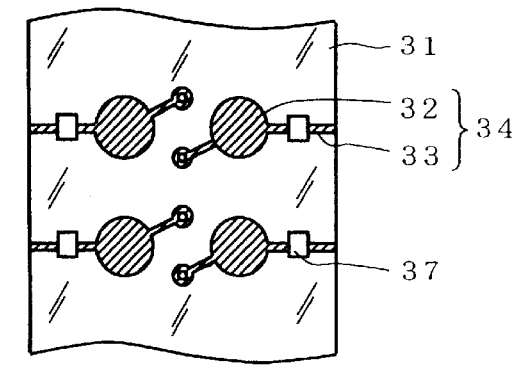

First, a conducting circuit 4 that comprises motherboard connecting electrodes 2 for interconnection with a motherboard (not shown) and plated leads 3 in electrical connection with the motherboard connecting electrodes 2 to permit electroplating of the motherboard connecting electrodes 2 is formed on an insulating base film 1, as in FIG. 1A. The plated leads 3 may be connected to continuous conductors situated at the two edges of the insulating base film 1 (not shown; see 31a in FIG. 3A depicting the prior art). These serve as electrodes during the plating process, described later.

The conducting circuit 4 of the semiconductor element mounting interposer is typically provided with through-holes 9, as in FIG. 1A, providing conducting paths from the motherboard connecting electrodes 2 to the opposite side of the insulating base film 1; this opposite side of the insulating base film 1 is provided with IC chip mounting bumps (not shown) for mounting a semiconductor element thereto.

A conducting circuit 4 of this type can be produced using ordinary methods. For example, the copper layer present on a single-sided copper-clad flexible board (consisting of a polyimide insulating film having a copper layer laminated thereto) is patterned using ordinary methods (IC chip mounting bumps may be formed as well if so required), and the side on which the bumps are present (i.e., the semiconductor element mounting face) then masked. Through-holes are then made in the polyimide insulating film, and the entire face thereof is then subjected to electroless copper plating, followed by electrolytic copper plating to thicken the copper layer. A photosensitive dry film is then laminated to the surface of the electrolytic copper layer, exposed through a photomask of the circuit pattern, and developed to produce an etching resist layer. Etching is then performed with a copper chloride or iron chloride etchant, and the etching resist layer is then removed by ordinary methods.

STEP (B)

Figure 1E:
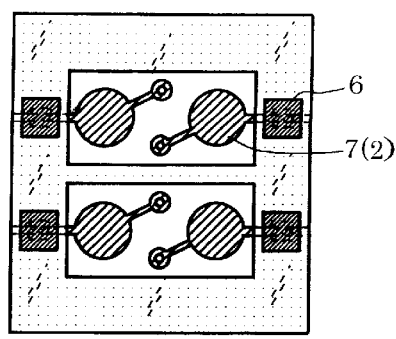
Figure 1B:
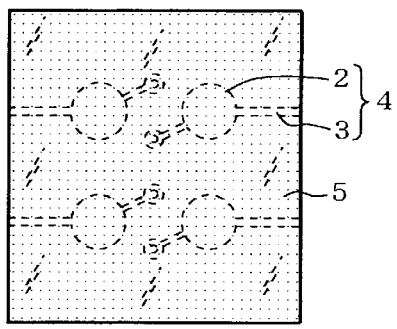

Next, a patterning resin layer 5 is formed over conducting circuit 4, as in FIG. 1B. A polyimide precursor layer 5, photosensitive polyimide layer, photoresist layer or the like may be used as the patterning resin layer 5. A polyimide precursor layer, being alkali-etchable, has the advantage of being patternable while at the same time being convertible through curing by means of an imidation process (for example, heat treatment) into a polyimide layer of excellent heat resistance and chemical resistance. Polyimide precursor layers of this type may be produced by coating a polyamic acid coating solution known in the art using a gravure coater or the like, and drying.

STEP (C)

Figure 1F:
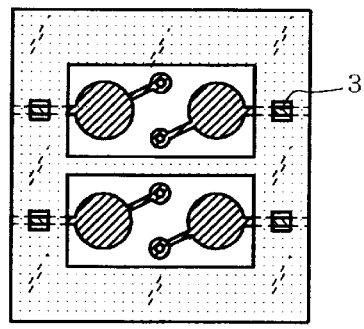
Figure 1C:
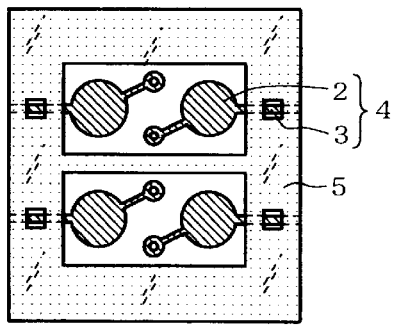

Next, the patterning resin layer 5 is etched using ordinary methods to expose the motherboard connecting electrodes 2 and plated leads 3 of conducting circuit 4, as in FIG. 1C. For example, a photosensitive dry film is laminated to the patterning resin layer 5, which is then exposed via a photomask of the desired configuration and developed to produce an etching resist layer. Etching is then performed with sodium hydroxide aqueous solution or the like, and the etching resist layer is then removed by ordinary methods.

STEP (D)

Figure 1G:
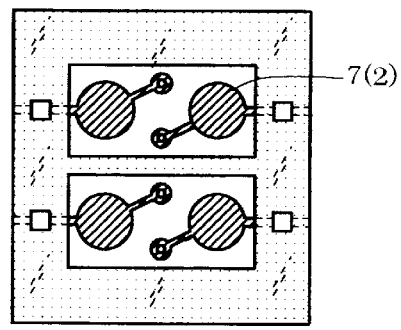
Figure 1D:
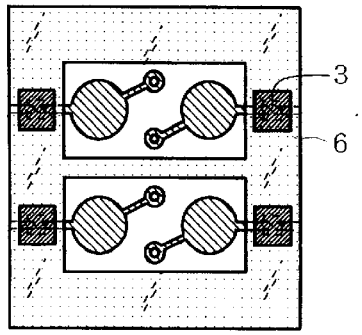

The exposed plated leads 3 are then masked with an electroplating resist layer 6, as in FIG. 1D, taking care to avoid covering the motherboard connecting electrodes 2.

STEP (E)

Next, the exposed motherboard connecting electrodes 2 are subjected to an electroplating process (for example, electroplating with gold) to deposit an electroplated metal layer 7 on the motherboard connecting electrodes 2, as in FIG. 1E, thereby facilitating application of solder balls to the motherboard connecting electrodes 2 for a ball grid array.

STEP (F)

Next, the electroplating resist layer 6 masking the plated leads 3 is removed to re-expose the plated leads 3, as in FIG. 1F.

STEP (G)

Next, the exposed plated leads 3 are removed through etching with a copper chloride, iron chloride etchant or the like, as in FIG. 1G. During this process the electroplated metal layer 7 functions as an etching resist for the underlying motherboard connecting electrodes 2. Accordingly, the electroplated metal layer 7 should be formed from a material (for example, gold) capable of resisting the etchant. Alternatively, in anticipation of etching, the electroplated metal layer 7 can be made rather thick. In this way, the length of the plated leads connecting to the electroplated metal layer 7 and the underlying motherboard connecting electrodes 2 can be appreciably reduced during the conducting circuit 4 formation step, without the need to produce holes using a die.

Figure 1H:
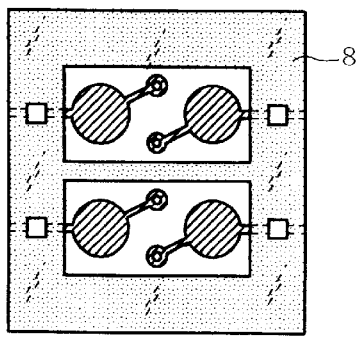

STEP (H)

Where the patterning resin layer 5 is a polyimide precursor layer, the polyimide precursor layer is then subjected to complete imidation to convert it to a polyimide layer 8, yielding a semiconductor element mounting interposer, as in FIG. 1H. STEP (H) (imidation of the polyimide precursor layer) may be carried out after STEP (G), or performed after patterning of the polyimide precursor layer, namely, between STEP (C) and STEP (D).

As will be apparent from the preceding, the first invention is characterized by using the etching process for cutting plated leads situated on the motherboard mounting side of a semiconductor element mounting interposer, thus allowing conventional methods to be used for producing the through-holes and semiconductor element-mounting face of the interposer.

According to the production method of the first invention, patterning of patterning resin layer 5 (STEP (C)) is performed in a single step; however, it may be performed in two steps (STEP (c) and STEP (e)), as in the second invention described hereinbelow.

STEP (a)

Figure 2A:
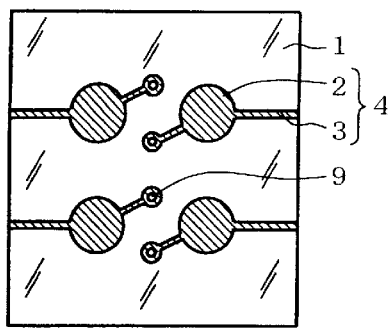
FIGS. 2A to 2G are step diagrams illustrating production of the semiconductor element mounting interposer of the invention.

As in STEP (A) of the first invention, first, a conducting circuit 4 that includes motherboard connecting electrodes 2 for interconnection with a motherboard, and plated leads 3 in electrical connection with the motherboard connecting electrodes 2 so as to permit electroplating of the motherboard connecting electrodes 2 is formed on an insulating base film 1, as in FIG. 2A. The plated leads 3 may be connected to continuous conductors situated at the two edges of the insulating base film 1 (not shown; see 31a in FIG. 3A depicting the prior art). These serve as electrodes during the plating process, described later.

STEP (b)

Figure 2E:
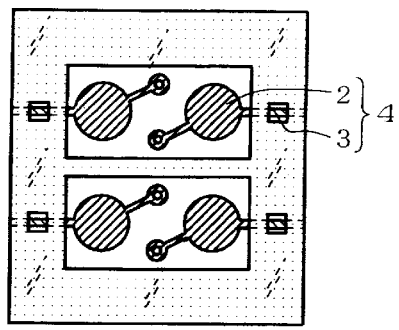
Figure 2B:
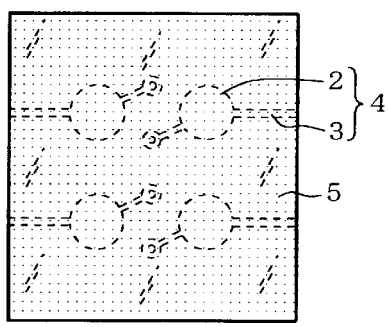

As in STEP (B) of the first invention, a patterning resin layer 5 of a polyimide precursor or the like is then formed on conducting circuit 4, as in FIG. 2B.

STEP (c)

Figure 2F:
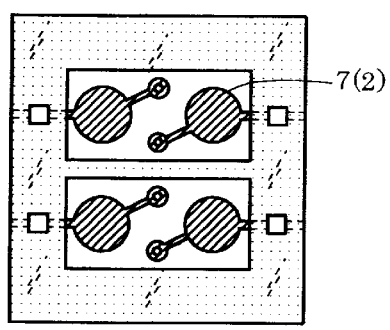
Figure 2C:
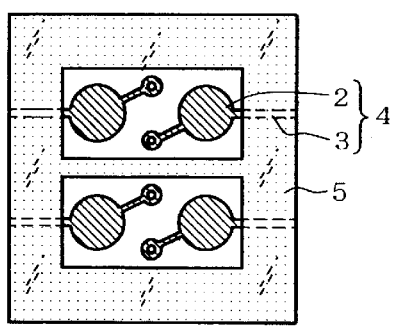

Next, following th e procedure of STEP (C) of the first invention, the patterning resin layer 5 is etched to expose the motherboard connecting electrodes 2 of the conducting circuit 4, as in FIG. 2C. In contrast to the first invention, etching is conducted so as to leave the plated leads 3 unexposed.

STEP (d)

Figure 2G:
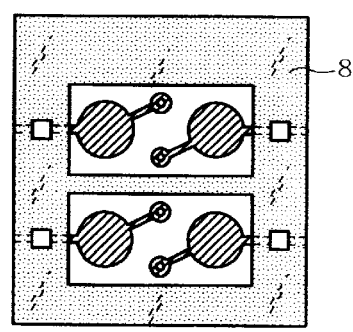
Figure 2D:
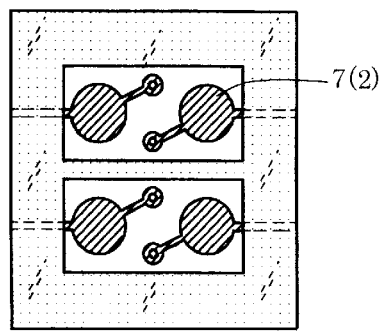

Next, following the procedure of STEP (E) of the first invention, the exposed motherboard connecting electrodes 2 are subjected to an electroplating process to deposit an electroplated metal layer 7 on the motherboard connecting electrodes 2, as in FIG. 2D.

STEP (e)

Next, following the procedure of STEP (C) of the first invention, the patterning resin layer 5 is etched to expose the plated leads 3 of the conducting circuit 4, as in FIG. 2E.

STEP (f)

Next, following the procedure of STEP (G) of the first invention, the exposed plated leads 3 are removed by etching, as in FIG. 2F.

STEP (g)

As in STEP (H) of the first invention, where the patterning resin layer 5 is a polyimide precursor layer, the polyimide precursor layer is then subjected to complete imidation to convert it to a polyimide layer 8, yielding a semiconductor element mounting interposer like, as in FIG. 2G.

In this second invention, a step for incomplete imidation of the polyimide precursor layer may be provided between STEP (c) and STEP (d), or as an additional step (h). The extent of this incompleteness can be adjusted through manipulation of the imidation parameters (heating temperature, heating duration, etc.) so as to enable patterning of the polyimide precursor layer per se, while at the same time avoiding damage thereto under the conditions to which it will be exposed in subsequent steps. Thus, by providing a step for incomplete imidation of the polyimide precursor layer, it is possible to improve the dimensional accuracy of conducting circuit 4 and improve interposer production yields.

As will be apparent from the preceding, the second invention is characterized by using an etching process for cutting the plated leads situated on the motherboard mounting face of a semiconductor element mounting interposer, thereby, as with the first invention, allowing conventional methods to be used for producing the through-holes and semiconductor element-mounting face of the interposer.

According to the present invention, there is now provided, in the production of semiconductor element mounting interposer for a CSP board or the like, a way to ensure electrical isolation of the motherboard connecting electrodes from one another and to make the plating leads as short as possible by means of etching, without the need to produce holes mechanically using a die.

The entire disclosure of the specification, claims and summary of Japanese Patent Application No. 11-164148 filed Jun. 10, 1999 is hereby incorporated by the reference.

What is claimed is:

1. A method for production of a semiconductor element mounting interposer for use in mounting a semiconductor element onto a motherboard, comprising the following steps (A) to (G):

(A) forming a conducting circuit that comprises motherboard connecting electrodes for interconnection with a motherboard, and plated leads in electrical connection with said motherboard connecting electrodes so as to permit electroplating of said motherboard connecting electrodes on an insulating base film;

(B) forming a patterning resin layer over said conducting circuit;

(C) etching said patterning resin layer so as to expose the motherboard connecting electrodes and plated leads of said conducting circuit;

(D) masking the exposed plated leads with an electroplating resist layer;

(E) subjecting the exposed motherboard connecting electrodes to an electroplating process so as to deposit an electroplated metal layer over the motherboard connecting electrodes;

(F) removing the electroplating resist layer masking the plated leads to re-expose the plated leads; and (G) removing the exposed plated leads through etching.

2. The method according to claim 1, wherein the patterning resin layer is a polyimide precursor layer.

3. The method according to claim 2, further comprising the following step (H) coming between step (C) and step (D) or after step (G):

(H) bringing about complete imidation of the polyimide precursor layer.

4. A method for production of a semiconductor element mounting interposer for use in mounting a semiconductor element onto a motherboard, comprising the following steps (a) to (f):

(a) forming a conducting circuit that comprises motherboard connecting electrodes for interconnection with a motherboard, and plated leads in electrical connection with said motherboard connecting electrodes so as to permit electroplating of said motherboard connecting electrodes on an insulating base film;

(b) forming a patterning resin layer over said conducting circuit;

(c) etching said patterning resin layer so as to expose the motherboard connecting electrodes of said conducting circuit;

(d) subjecting the exposed motherboard connecting electrodes to an electroplating process so as to deposit an electroplated metal layer over the motherboard connecting electrodes;

(e) etching said patterning resin layer so as to expose the plated leads of said conducting circuit; and (f) removing the exposed plated leads through etching.

5. The method according to claim 4, wherein the patterning resin layer is a polyimide precursor layer.

6. The method according to claim 5, further comprising a step (g) coming after step (f):

(g) bringing about complete imidation of the polyimide precursor layer.

7. The method according to claim 6, further comprising a step (h) coming between step (c) and step (d) or between step (d) and step (e):

(h) bringing about incomplete imidation of the polyimide precursor layer.

* * * * *